United States Patent
Barbara et al.

(10) Patent No.: US 7,288,939 B1
(45) Date of Patent: Oct. 30, 2007

(54) CRYOGENIC NMR PROBE

(75) Inventors: Thomas M. Barbara, Portland, OR (US); Alexander M. J. Hudson, Palo Alto, CA (US); Atholl A. V. Gibson, Walnut Creek, CA (US)

(73) Assignee: Varian Inc., Palo Alto, CA (US)

( * ) Notice: Subject to any disclaimer, the term of this patent is extended or adjusted under 35 U.S.C. 154(b) by 0 days.

(21) Appl. No.: 11/504,845

(22) Filed: Aug. 16, 2006

(51) Int. Cl.
*G01V 3/00* (2006.01)

(52) U.S. Cl. .................. 324/322; 324/318

(58) Field of Classification Search ......... 324/300–322
See application file for complete search history.

(56) References Cited

U.S. PATENT DOCUMENTS

| | | | |
|---|---|---|---|
| 5,508,613 A * | 4/1996 | Kotsubo et al. ............. 324/318 |
| 5,602,477 A * | 2/1997 | McCarthy et al. .......... 324/315 |
| 6,263,215 B1 * | 7/2001 | Patton et al. ................ 455/561 |
| 6,828,889 B1 * | 12/2004 | Zaput ......................... 335/216 |
| 2005/0046423 A1 | 3/2005 | Marek |

OTHER PUBLICATIONS

U.S. Appl. No. 11/260,988, filed Oct. 28, 2006, Lukens et al.

* cited by examiner

*Primary Examiner*—Brij Shrivastav
(74) *Attorney, Agent, or Firm*—Bella Fishman; Edward H. Berkowitz

(57) ABSTRACT

The thermal performance and vacuum properties of a cryogenic NMR probe are improved when thermal control is implemented by conductive heat transfer to a cold head cooled by a heat exchanger to below the selected operating temperature. The heat load is manipulated by locating a heater to produce a more nearly constant heat load in conjunction with pulsed RF power and in one embodiment transferring such heater power through a common thermal path. In another embodiment, the heater power is conductively transferred directly to the heat exchanger.

14 Claims, 5 Drawing Sheets

CRYOGENIC NMR PROBE

RELATED APPLICATION DATA

This application is related to the U.S. patent application entitled "Efficiently Cryo-pumped NMR Cryogenic Probe" by the inventors Thomas Barbara and Alexander M. J. Hudson, which application is filed concurrently with the present application and assigned to the assignee of the present application.

BACKGROUND OF THE INVENTION

The present work is in the field of NMR apparatus and relates particularly to an NMR probe operating at cryogenic temperatures.

An NMR probe coil couples an RF transmitter/receiver to sample nuclei. Operation of the RF coil at cryogenic temperatures contributes a very high efficiency through enhanced Q of the resonant circuit and significant reduction of Johnson noise. These factors provide enhanced sensitivity for NMR spectra and have motivated considerable effort to realize an improved cryogenic NMR probe.

A central component within the cryogenic probe is the "cold head" (that portion within the probe structure providing thermal, and often, structural support for the RF coil). As used herein, the term is inclusive of RF coil(s), heat exchanger, structural elements and the like, all intended to be sustained at a selected operating temperature. The cold head is desirably thermally regulated to maintain that selected operating temperature. A heat exchanger comprising a part of the cold head cools the cold head to somewhat below the operating temperature, while the application of RF power to the coil adds heat to the environment and increases the thermal load on the heat exchanger with a resulting temperature rise. In order to permit temperature regulation, a coolant heater is provided to raise the temperature of the coolant inflow to the heat exchanger at the cold head. By adjustment of the heater power (or alternately by adjustment of coolant flow rate), dynamic thermal equilibrium is achieved. Regulation of the temperature of the cold head within a narrow range is necessitated for a number of reasons. Salient of these is variation with temperature of magnetic susceptibility of materials employed in the environs of the cold head resulting in magnetic field disturbance in the neighborhood of the sample; temporal variation of temperature over lengthy data acquisition, and the stability of various parameters of the equipment. To the extent of such disturbance, the precision of NMR data is degraded. NMR is necessarily practiced in a time varying regime of RF power as applied in pulse sequences and often with substantial RF power application from a (second) decoupler coil. Thermal dependence of magnetic field inhomogeneities results in a broadening of the resonant lineshape.

It is also recognized that the mechanism of cryogenic pumping is operative within the cryostat to stabilize residual gasses by adsorption on cold surfaces. Utility of the cryo-pumping mechanism is known in prior art where the accumulation of residual gas on "cold plates" provides at least temporary stabilization and removal from the excitation/de-excitation process. This process is saturable and the cold plate pumping surfaces are allowed to warm at maintenance intervals to liberate these gasses for pumping by other pumping modalities. It is common to provide turbomolecular pumps, chemical getters or ion pumping apparatus to remove these residual gasses. The effectiveness of cryo-pumping depends upon the residual gasses and the nature of the cryo-pumping surfaces among other critical particulars. Such matters are outside the scope of the present work.

One prior art apparatus, exemplary of the above description, is schematically described in its essentials at FIG. 2a. Cold head 70 comprises a thermally regulated support structure and RF coil 71, coil former (not shown) and mounting flange 70a. The cold head 70 is cooled to a temperature $T_1 - \Delta T$, somewhat below a nominal desired operating temperature of $T_1 K$ (for example, 25 K) by heat exchanger 78. Details of the coupling of the RF coil 71 to the RF circuit are not shown. It should also be understood that the probe cryostat housing 80 has an annular geometry defining a well or bore 82 wherein a sample may be introduced at room temperature.

Coolant inflow conduit 84 provides coolant to heat exchanger 78 and warmed coolant is removed through outflow conduit 85. In order to thermally regulate the cold head, it was known in prior art to drive coolant flow at a rate sufficient to maintain the heat exchanger at a temperature $\Delta T$, slightly lower than $T_1 K$ and to provide a heater 88 disposed between a portion of the inflow conduit 84 and the heat exchanger 78 to warm the inflowing coolant sufficiently to raise the operating temperature of the heat exchanger to $T_1$. In this manner, heat developed from RF power dissipation is transported away from the cold head 70 and the operating temperature restored by heating the coolant (or alternatively, reducing the coolant flow rate) in response to an appropriate thermal sensor. One example of this prior art is disclosed in the publication US 2005/0046423A1

The present work has detected a degree of cryo-pumping functionality at the outer surface of this inflow conduit, and that functionality is improved in the present work. Heat is applied to the inflowing coolant prior to receipt of coolant by the heat exchanger 78. This acts adversely on the cryo-pumping achieved on the outer surface of conduit 84. The cryo-pumped vapors (principally hydrogen) are in some degree released with consequent deleterious effect as increased RF noise. The present work is directed to amelioration of these undesirable characteristics.

SUMMARY OF THE INVENTION

An NMR lineshape minimally affected by thermal fluctuation is one desiderata of the present work and this is achieved through improved thermal stability of the cold probe components. To this end, the heater supplying heat to the cold head heat exchanger is disposed in close proximity with that heat exchanger and preferably in conductive contact with the heat exchanger structure itself or with the RF coil support structure of the cold head. Robust and reliable cryo-pumping of residual gas in the probe cryostat and improved thermal regulation of the cold head are achieved by artful placement of the heater in respect of the heat exchanger. In one embodiment the heater is disposed proximate the heat exchanger with several consequences: (a) the coolant inflow conduit, prior (in flow direction) to the point of thermal communication with the heater, presents a more nearly constant temperature of the inlet capillary resulting in a substantially greater isothermal surface for cryo-stabilization of remanent gasses; (b) the magnetic homogeneity remains more stable under the applications of time varying RF loads to the probe; (c) the response time for compensating thermal excursions is reduced. In one embodiment a non-inductive heater supplies heat directly to the heat exchanger through conduction. In an alternative embodiment heat is transferred to the coolant inflow to the heat exchanger at substantially the inflow port of the heat exchanger without substantial extent of inflow conduit between heater and heat exchanger. In another embodiment, a heater of appropriate power capability is disposed directly on the cold head in direct (conductive) thermal communication with the RF coil flange or support structure. A temperature sensor appropriately disposed on the cold head provides a signal for control of the heater.

DETAILED DESCRIPTION OF THE INVENTION

Figure 1:
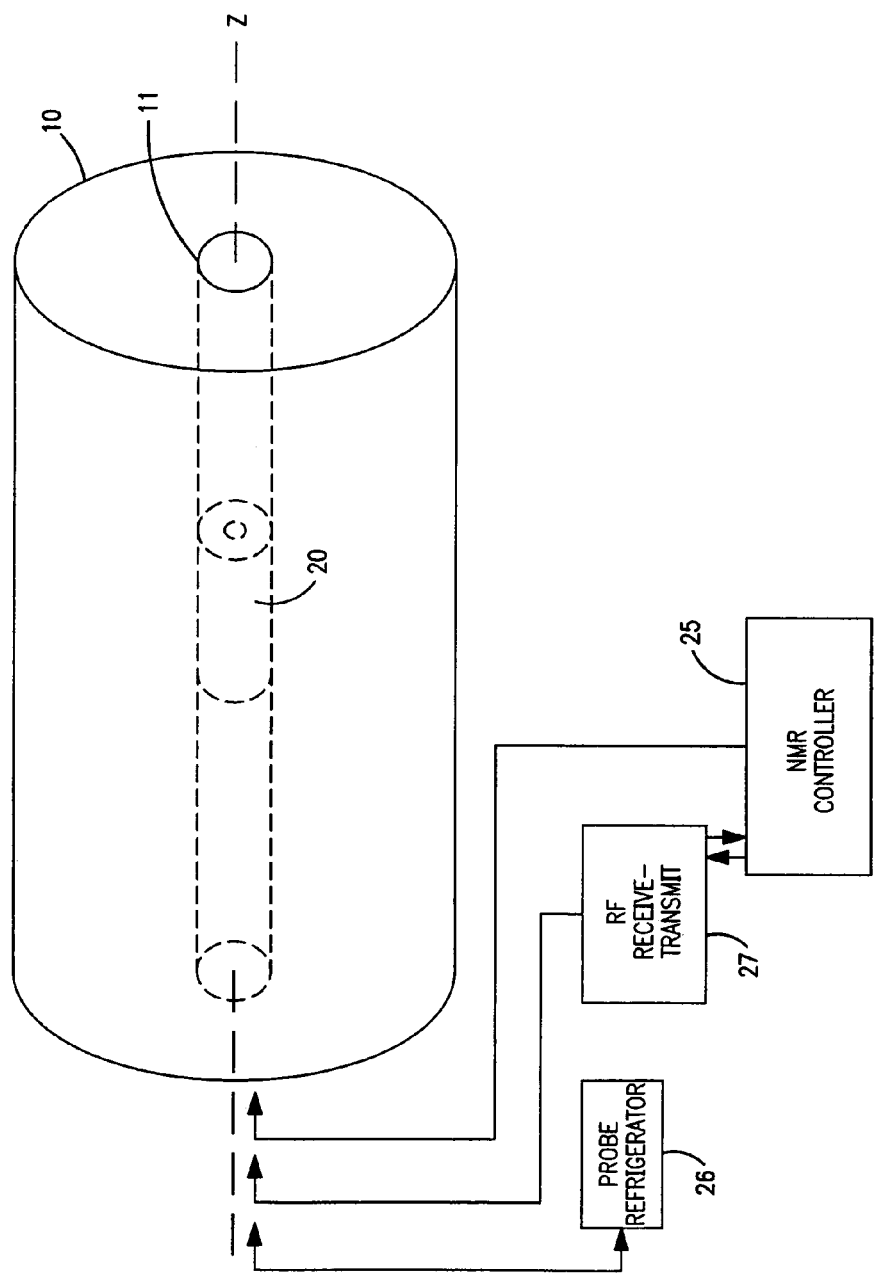
FIG. 1 is a schematic illustration of the context of the present work.

The context of the present work is conveniently described with the aid of FIG. 1. Please note that wherever convenient, the same numeric label is retained among the several embodiments and figures.

Figure 2A:
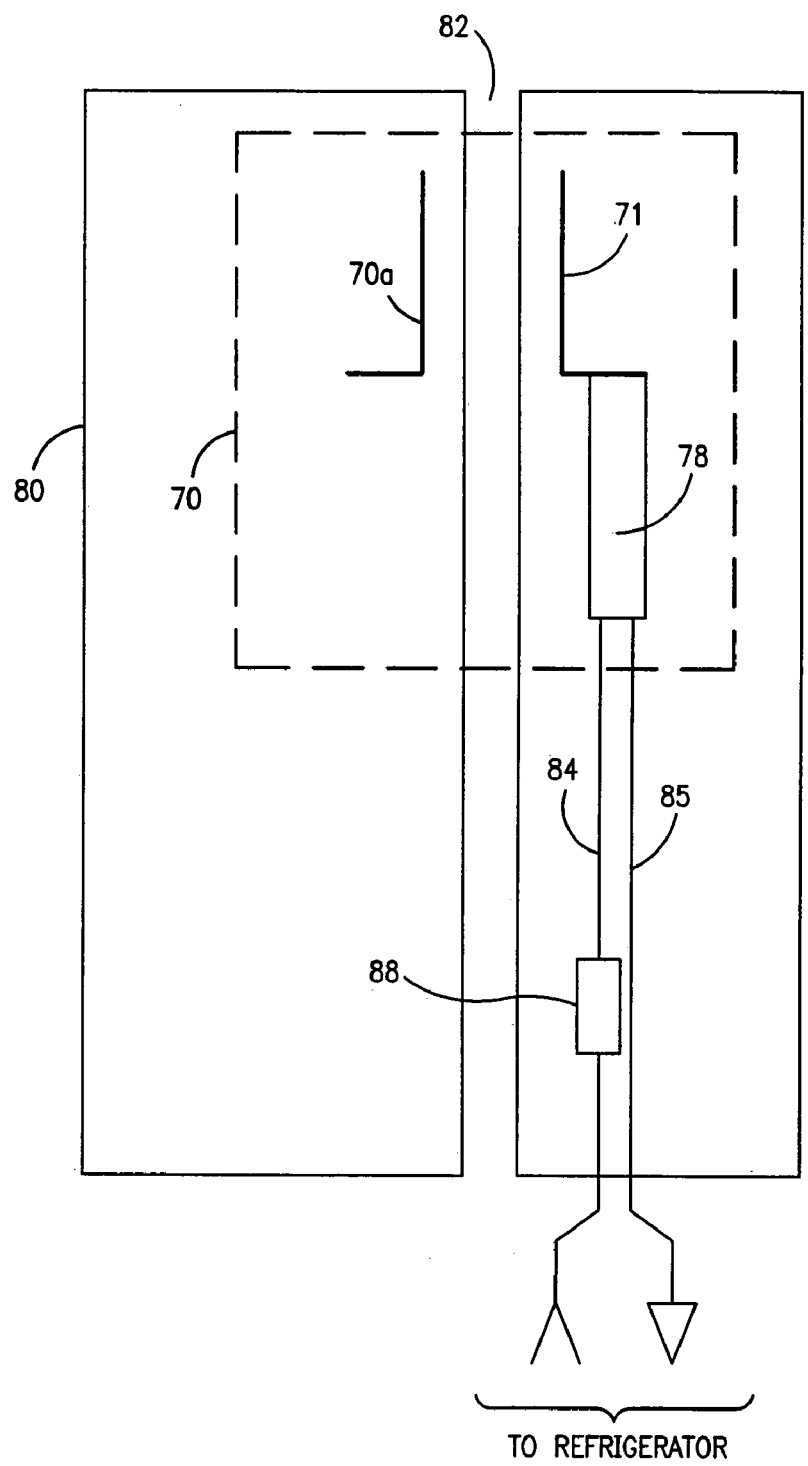
FIG. 2a is a schematic representation of a prior art cryogenic probe.

A superconducting magnet cryostat 10 includes a bore 11. A probe cryostat 20 has a similar outer annular geometry coaxial with bore 11 and a central coaxial bore of cryostat 20 defining a sample bore 82 shown in FIG. 2a. The sample (not shown) is typically studied at room temperature or some selected temperature. The sample is thermally isolated from the internal low temperature of the probe cryostat 20 and introduced along axis z. Magnet cryostat 10 and probe cryostat 20 are typically separate and independent structures although this is not a requirement. Refrigeration for probe cryostat 20 as well as RF and DC power and control signals are communicated to probe cryostat 20 through bore 11. Probe refrigerator unit 26 is of known design as is RF receive-transmit unit 27.

One of skill in the art recognizes that the typical NMR probe includes a decoupler coil as well as the transmit/receive coil more closely coupled to the sample. In practice, the decoupler coil generates a far greater RF heat load and contributes limiting thermal properties in cryogenic probe operation. It is not necessary for the purposes of this description to distinguish among these coils as the source of RF heat load.

Figure 2B:
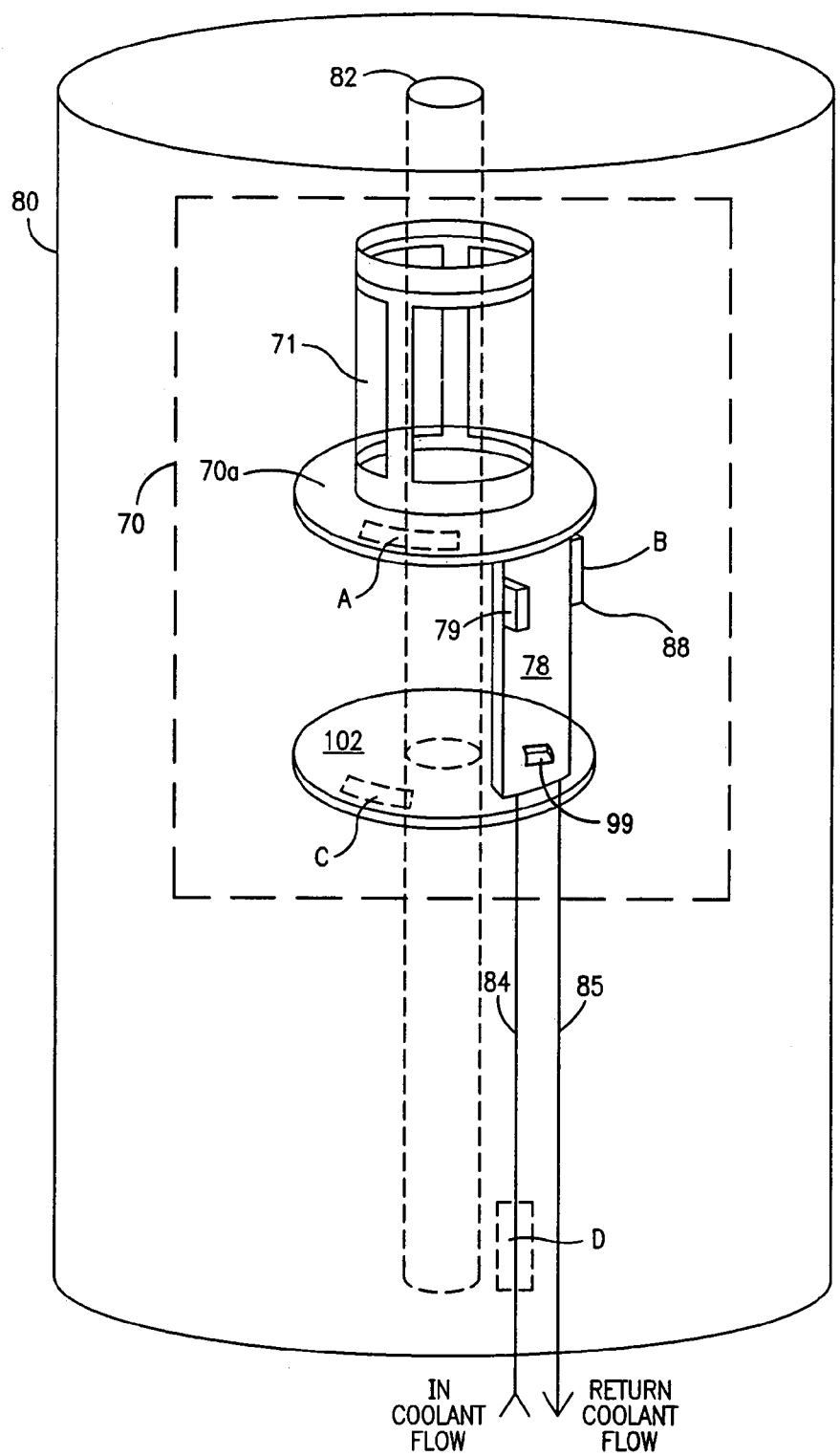
FIG. 2b represents the features of the present work.

In FIG. 2b there are shown the features which, taken together, have been found to provide much improved cryogenic probe performance. The heater 88 is now disposed proximate the cold head heat exchanger 78. The probe cryostat housing 80 supports a vacuum environment for thermal isolation. A particular feature of the present work is the situation of heater 88, preferably disposed to supply heat directly to heat exchanger 78 by conductive paths. In one arrangement thermal equilibrium is established between energy supplied by the heater 88 and the heat removed from heat exchanger 78 through (principally) warm coolant outflow therefrom. For one cryogenic probe of the preferred embodiment, thermal equilibrium at a designed temperature of 25 K is established with a closed cycle He refrigerator and a quiescent heater power of about 4 watts. This quiescent state of thermal equilibrium is disturbed by the application and removal of RF power applied to RF coil 71. Temperature sensor 79 senses a decline in temperature of the heat exchanger 78 as the RF heating increment is removed and provides an electrical and provides a signal to regulation controller 75 to respond for thermal regulation by raising the heater current a measured increment. As a practical matter, the decoupler coil sustains a major power dissipation whereas the RF power applied to an observe coil is minimal by comparison. For present purposes, it is only necessary to recognize that RF power dissipated in a coil of the probe is a non-continuous source of heat. The application of RF power provides an anticipatory signal which may be incorporated into the thermal regulation regime to provide a more rapid, non-oscillatory return to the quiescent thermal operating state. A more detailed consideration of the use of an anticipatory signal is provided in the U.S. application Ser. No. 11/260,988, commonly assigned.

Different dispositions of the heater 88 relative to the heat exchanger 78 were examined. In one prior art cryogenic probe, the heater 88 (in this case for warming the inflowing coolant) was located approximately 60 cm from the heat exchanger 78 along the coolant inflow conduit 84 at a position labeled D in FIG. 2b. The inflow conduit 84 is a stainless steel tube of 0.032 inch i.d. and 0.050 inch o.d. This provides a very high thermal impedance. A second position (designated C) for consideration was conveniently available on a circuit board 102 displaced by about 2.35 inches from the cold head 78 and in thermal contact with the heat exchanger 78. It should be understood that the circuit board 102 serves to support signal conditioning circuitry and is also maintained at the temperature of the cold head. A third position, shown in FIG. 2b (labeled B), may be described as intimate thermal contact of a non-inductive chip resistor at the top surface of the heat exchanger. A fourth position (designated A) was located on the supporting flange 70a of the RF (decoupler) coil 71 where a pair of chip resistors were disposed in intimate thermal (conductive) contact with the flange 70a. For each of these arrangements, the proton resonance was observed at 600 MHz with minimal disturbance of the thermal regulation. A second observation was effected with 1.1 watt of CW-RF power applied at the $C^{13}$ resonant frequency, thermal equilibrium re-established and the width of the proton peak at half height was again recorded without any compensatory field shimming.

TABLE 1

| Heater Position | $^1$H NMR width (Hz) @ Half ht. (0 decoupler pwr.) | $^1$H NMR width (Hz) @ Half ht. (decoupler on) | Resolution Broadening % |
|---|---|---|---|
| A | 1.17 | 1.37 | 17 |
| B | 0.87 | 1.55 | 78 |
| C | 0.68 | 1.47 | 116 |
| D | 0.92 | 2.23 | 142 |

With decoupler power applied at thermal equilibrium, the resonant peak (at 600 MHz) is broadened for the reasons discussed. This broadening is least where the heater is most directly positioned to affect the smallest temperature change on the probe structures. It is probable that some broadening is contributed, at position A, by the heater current in the chip resistors. Such effect may be compensable by adjustment of chip resistor orientation, pairing, or specialized design.

Positions A and B (or C) are characterized respectively, by conductive heat transfer to/from the RF coil (decoupler) to the heat exchanger 78. Position A is characterized as sharing with the RF (decoupler) coil the same thermal path, or more precisely, the same thermal impedance ($R_{fx}$ in FIG. 3a). Position B provides efficient heat transfer directly to the heat exchanger 88 but the finite thermal impedance $R_{fx}$ presented by mechanical support of the RF coil 71 sustain the coil at a temperature slightly higher than the heat exchanger 78. This configuration presents the lowest thermal impedance for thermal coupling of heat source to heat exchanger. It is worth noting that there is a subtle distinction in the approaches represented by positions A and B for the heat source as discussed in greater detail below. Briefly, at position A, temporal uniformity of the heat load is the desiderata, whereby the heater 88 is active during the intervals where RF power is not dissipated. At position B, direct thermal regulation of the heat exchanger 78 is the operative feature, and the cold head components are simply conductively coupled to the thermally regulated heat exchanger 78.

Direct temperature measurement of the heat exchanger 88, through a separate temperature sensor 99 specific to this purpose (not to be confused with the feedback sensor 79), shows that heater location D produced a temperature change of 0.25 K at the special sensor 99. Using heater location A, the measured temperature change was 0.01 K. It is evident that conductive heat transfer directly to the heat exchanger of the cold head, or the cold head itself, is a very effective mode of maintaining the probe components in thermal equilibrium.

Figure 3A:
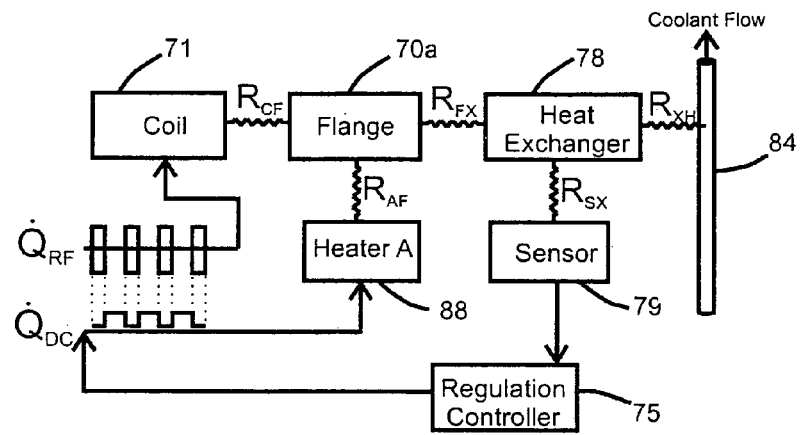
FIGS. 3a-3c illustrate the thermal distinctions of the configurations of Table 1.
Figure 3B:
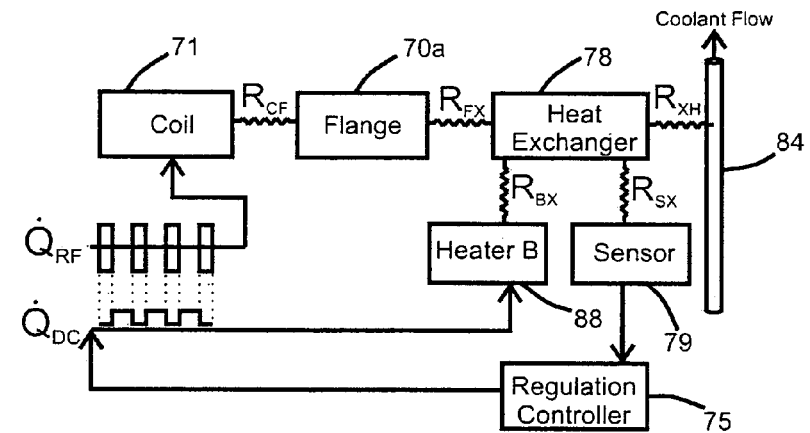
Figure 3C:
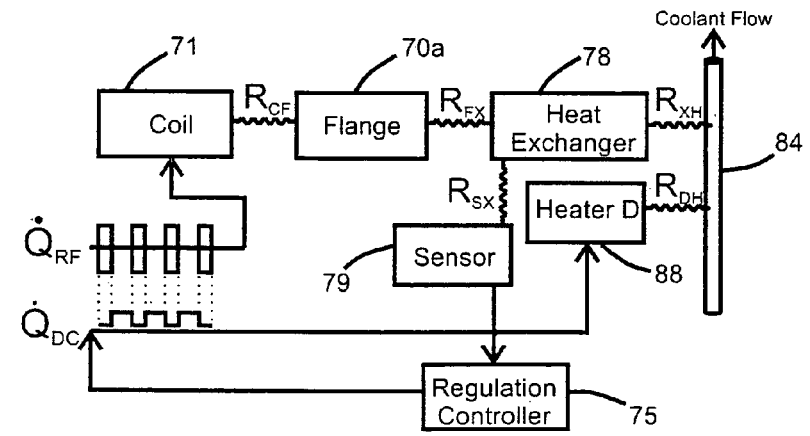

A comparison of these thermal configurations is better understood with simplified schematic sketches of FIGS. 3a-3c. Thermal behavior of the cryogenic probe may be modeled as a series of isothermal reservoirs connected by effective thermal impedances, $R_{jk}$ between reservoirs j and k as shown in FIGS. 3a-3c. The rate of heat flow, dQ/dt from reservoir j to reservoir k causes a temperature difference $\Delta T = d/dt\,(Q) \cdot R_{jk}$ between them. The preferred arrangement of the present work appears in FIG. 3a (in obvious notation) where the direct heat load on the heat exchanger 78 is a combination of heat input, $Q_{DC}$, from the heater 88 through an impedance $R_{AF}$ (approaching null value) and the RF heating $Q_{RF}$ (from NMR operations) through impedance $R_{CF}$ and this combined heat quantity flows through $R_{FX}$ to heat exchanger 78. The sensor 79 is coupled through another impedance $R_{SX}$ (approaching null value) to the heat exchanger 78 to sense the temperature thereof and close the loop to the heater 88 through a regulatory PID controller of conventional design. At FIG. 3b the configurations B (or C) are distinguished from configuration A through the difference in the point of conductive thermal contact for the heater 88 through impedance $R_{BX}$ (approaching null value) to heat exchanger 78. The position C is simply an alternative for engineering convenience in certain circumstances and introduces another thermal impedance between the heat exchanger 78 and heater 88 in its C location.

The prior art configuration D, as shown in FIG. 3c is characterized by heat transfer from heater 88 through an effective impedance $R_{DH}$ to the inflowing coolant and thence from that warmed coolant through $R_{XH}$ to the heat exchanger 78. The impedance $R_{DH}$ will necessarily involve heat exchange to the flowing coolant requiring an additional heat exchanger, which is not required with the conductive embodiments of positions A and B (or C). In this case, the closed regulatory loop encompasses additional heat transport delay due to coolant flow.

Figure 4:
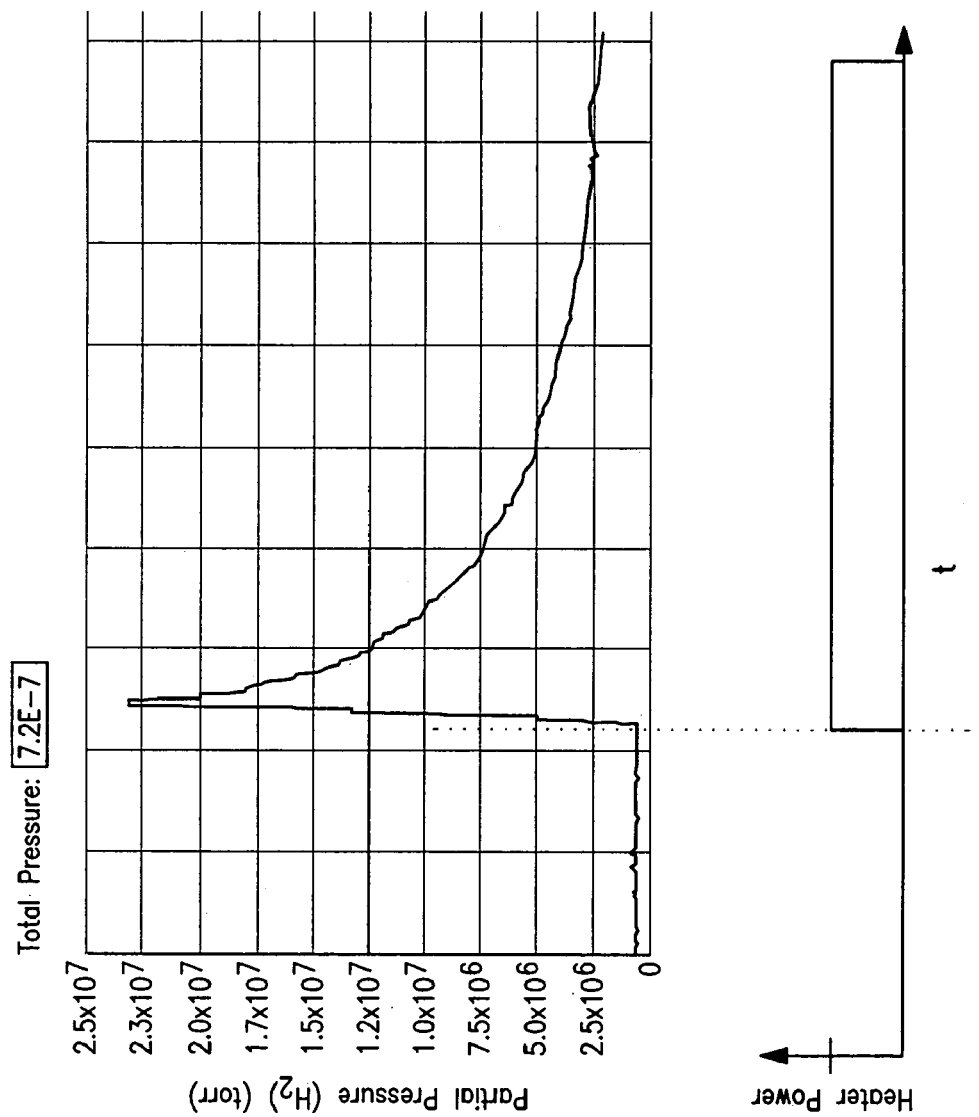
FIG. 4 shows the cryo-pumping effect of the inlet conduit.

Heater placement influences the cryo-pumping function observed at the outer surface of inflow conduit 84. In prior art apparatus of FIG. 2a, the heater 88 occupies position D, an intermediate position in dividing the inflow conduit 84 into two portions (above and below the heater 88 in position D). The position above the heater is maintained at an elevated temperature and therefore degrades the cryo-pumping efficacy of the inflow conduit 84. Changes in the RF heat load result in changes in the temperature of this inflow conduit, thereby condensing or releasing gasses from the conduit 86 and the heater body during probe operation. FIG. 4 is an example of the magnitude this effect, obtained with a residual gas analyzer coupled to the cryostat enclosure. During continuous external pumping of the probe vacuum, heater power applied and maintained at position D produces a strong pressure transient from gasses liberated from heater and conduit surfaces. (The vacuum recovery is limited by vacuum conductance in the example.) The present work, in placing the heater 88 directly in conductive contact with the heat exchanger, allows the greater part of conduit 84 to remain substantially isothermal at the coldest temperature prevailing within the cryostat thereby providing additional cryo-pumping functionality and eliminating temperature transients that evaporate condensed gasses.

Placement of the heater in closer proximity to the sensitive region of the probe requires a non-inductive character for the heater component. For example, the heater placed in positions A or B is served by a simple ceramic substrate thick film chip resistance such as IMS026-c-50J, available from International Manufacturing Services, Portsmouth R.I. It might be noted that prior art placement of a heat source remote from the cold head might tolerate an inductive heat source, although no advantage is realized. A heat source disposed as here described (positions A, B, or C) is necessarily non-inductive. Briefly summarized, the change of configuration from D to A provides thermal contact between the heat source and the heated mass of heat exchanger 78 which better serves the thermal performance of the probe. That is, the conductive relationship (particularly configuration A) as compared with heat transfer through the medium of the flowing coolant (configuration D) provides a much lower change in temperature of the probe cold components during regulated operation.

The heater 88 has been described as comprising chip resistor(s). This is not the exclusive example of a satisfactory heat source for the present purposes and straightforward variations are recognized. An equivalent heater 88 (for position A) includes a distributed heater formed as a composite and built on a (preferably) sapphire substrate 70a. Other embodiments can utilize an optical source, such as a laser arranged to concentrate optical radiation on an optical absorber disposed as described above and functioning as heater 88. Another embodiment (for position A or its equivalent) is readily achieved using another non-resonant RF coil, or even the same coil 71 (tuned relatively far from resonance) as a heat source when coil 71 is not active on resonance. It is apparent that these alternative heat sources operate to provide a more nearly constant average heat load which is transferred to the heat exchanger by conduction through the same thermal impedances as the coil 71, such as coil support flange 70a for example. A further advantage accompanies the geometry of the conductive arrangements described herein, in that the inlet conduit exhibits a greater surface area at the lower temperature of the (unheated) coolant and therefore cryo-pumping capacity through this agency is increased. Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. A method for improved thermal control of a cryogenic NMR probe subject to thermal excursions from RF power dissipation, comprising the steps of:
   a) evacuating the interior of the housing of said NMR probe;
   b) cooling a heat exchanger of the cold head of the NMR probe to a temperature $T_1-\Delta T$ below the selected operating temperature, $T_1$, thereof;
   c) continuously sensing the temperature of said cold head whereby said temperature varies over a range from $T_1-\Delta T$ to a temperature greater than T1 in response to said thermal excursions;
   d) providing a selected quantity of heat to a heater in response to said step of sensing, wherein said selected quantity of heat raises the temperature of said cold head to the selected operating temperature thereof; and
   e) transferring said selected quantity of heat by conduction from said heater to said cold head to effect said rise of temperature, whereby improved temperature control produces improved stability of magnetic susceptibility of said coldhead.

2. The method of claim 1, wherein said step of transferring comprises conducting said quantity of heat to the heat exchanger through the same thermal impedances encountered by said thermal excursions, whereby variations of the heat load of said cold head is minimized.

3. The method of claim 1, wherein said step of transferring comprises conducting said quantity of heat directly to said heat exchanger.

4. The method of claim 3, wherein the step of cooling comprises flowing coolant to the cold head through a conduit having outer surfaces exposed to residual gasses within said evacuated housing whereby a greater area said surfaces remain at temperatures conducive to stabilizing a portion of said gasses through cryo-pumping.

5. An NMR cryogenic probe comprising:
   a) a cryostatic enclosure, said enclosure comprising a bore accommodating a sample under study;
   b) a resonant RF coil for coupling to said sample;
   c) a cold head disposed within said enclosure comprising means for thermally supporting said RF coil, said cold head comprising a heat exchanger establishing a desired temperature $T_1-\Delta T$ for said RF coil; and
   d) a heater supplying a sufficient quantity of heat to adjust the temperature of said RF coil to $T_1$, said heater disposed to transfer heat through conduction to said cold head.

6. The NMR probe of claim 5, further comprising a sensor determining the instantaneous thermal load on said cold head and regulatory apparatus to control said heater in response to said sensor.

7. The NMR probe of claim 6, wherein said heater is disposed to conductively transfer heat directly to said heat exchanger.

8. The NMR probe of claim 6, wherein said heater is disposed proximate said resonant RF coil to transfer heat through substantially the same said thermal supporting means to said heat exchanger.

9. The NMR probe of claim 7, wherein said heater comprises at least one chip resistor and a DC current source.

10. The NMR probe of claim 8, wherein said heater comprises an optical power source for illuminating an optical absorber, said absorber disposed proximate said resonant RF coil to transfer heat through substantially the same said thermal supporting means to said heat exchanger.

11. The NMR probe of claim 8, wherein said heater comprises an optical power source for illuminating an optical absorber, said absorber disposed in conductive relationship to said heat exchanger.

12. The NMR probe of claim 8, wherein said heater comprises a second RF coil for dissipating RF power, said second coil not coupled to said sample.

13. The NMR probe of claim 6, wherein said heater comprises said resonant RF coil and a detuning means for tuning said resonant RF coil off resonance.

14. The NMR probe of claim 6, wherein said RF coil is mechanically supported from said cold head.

* * * * *